United States Patent
Peng et al.

(10) Patent No.: US 6,749,453 B2
(45) Date of Patent: Jun. 15, 2004

(54) CPU SOCKET WITH ENHANCED BASE STRUCTURE

(75) Inventors: Fujin Peng, Kunsan (CN); Jun Cheng, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 47 days.

(21) Appl. No.: 10/457,984

(22) Filed: Jun. 9, 2003

(65) Prior Publication Data

US 2004/0058579 A1 Mar. 25, 2004

(30) Foreign Application Priority Data

Sep. 25, 2002 (TW) ........................................ 91215147 U

(51) Int. Cl.⁷ .............................................. H01R 13/62
(52) U.S. Cl. ........................ 439/342; 439/259; 439/266
(58) Field of Search ........................ 439/259, 263–266, 439/268, 270, 342

(56) References Cited

U.S. PATENT DOCUMENTS

| | | | |
|---|---|---|---|
| 6,247,953 B1 * | 6/2001 | Walkup et al. | 439/342 |
| 6,280,223 B1 * | 8/2001 | Lin | 439/342 |
| 6,338,639 B1 | 1/2002 | Trout et al. | |
| 6,368,137 B1 | 4/2002 | Orwoll | |
| 6,371,785 B1 | 4/2002 | Howell et al. | |
| 6,406,317 B1 * | 6/2002 | Li et al. | 439/342 |
| 6,544,065 B1 * | 4/2003 | Howell et al. | 439/342 |

\* cited by examiner

*Primary Examiner*—Tho D. Ta
*Assistant Examiner*—Ann McCamey
(74) *Attorney, Agent, or Firm*—Wei Te Chung

(57) ABSTRACT

An electrical connector (1) for electrically connecting an electronic package with a circuit substrate. The connector includes an insulative base (10), a cover (30), and an actuation device (40) for actuating the cover to slide along the base. The base defines a plurality of receiving passageways (103) respectively receiving corresponding electrical terminals therein. The cover defines a plurality of through holes (31) corresponding to the receiving passageways. The base further defines a receiving space (100) at one end thereof. A circular hole (108) is defined in a bottom wall of the base below the receiving space, which can ensure that the base at the receiving space has a uniform thickness and enhanced intension during manufacturing.

8 Claims, 3 Drawing Sheets

CPU SOCKET WITH ENHANCED BASE STRUCTURE

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to an electrical connector having an enhanced base structure.

2. Description of Prior Art

Electrical connectors are widely used in personal computer (PC) systems for electrically connecting electronic packages such as CPUs with circuit substrates such as PCBs. Typical such electrical connectors are known as CPU sockets. A typical CPU socket comprises a base soldered and electrically connected with a PCB, a cover slidably mounted on the base and having a CPU attached thereon, and an actuation device for actuating the cover to slide along the base.

The CPU has a plurality of lead pins depending from a bottom surface thereof and arranged in a rectangular array. The cover of the CPU socket has a plurality of through holes arranged in a rectangular array corresponding to the lead pins of the CPU. The base of the CPU socket has a plurality of receiving passageways arranged in a rectangular array corresponding to the lead pins of the CPU. Each receiving passageway receives an electrical terminal therein.

In use, the CPU is attached to the CPU socket. The pins of the CPU extend through the corresponding through holes of the cover and are received in the corresponding passageways of the base. The pins of the CPU do not contact the corresponding electrical terminals. Thus the CPU is attached on the CPU socket with zero insertion force. In particular, the pins of the CPU are prevented from being flexed by sudden force being applied thereto by the electrical terminals. Then, the actuation device actuates the cover to slide along the base. When the cover reaches a closed position with respect to the base, the actuation device pushes the pins of the CPU into mechanical and electrical engagement with the corresponding electrical terminals.

This kind of conventional CPU socket is detailed in "Development of a ZIF BGA Socket" (Connector Specifier Magazine, May 2000). Similar kinds of CPU sockets are also disclosed in U.S. Pat. Nos. 6,280,223, 6,368,137, 6,371,785, 6,338,639 and 6,406,317.

The base of the conventional CPU socket generally defines a receiving space at one end thereof. A quadrate hole is defined in a bottom wall of the receiving space. The bottom wall of the receiving space is relatively thin, and stress on four right angles of the quadrate hole is relatively large during manufacturing. Thus, the bottom wall at the right angles is prone to distort when the actuation device is assembled into the base. Furthermore, when molding the base during manufacturing, melted plastic material cannot fully fill a region of the base at the quadrate hole, especially at the right angles of the quadrate hole. This results in a thickness of the bottom wall at the receiving space being uneven.

In view of the above, a new electrical connector that overcomes the above-mentioned disadvantages is desired.

SUMMARY OF THE INVENTION

Accordingly, an object of the present invention is to provide an electrical connector for electrically connecting an electronic package such as a central processing unit (CPU) with a circuit substrate such as a printed circuit board (PCB), in which the connector has an enhanced base structure that provides the connector with uniform dimensions and enhanced intension during manufacturing.

To achieve the above-mentioned object, an electrical connector in accordance with a preferred embodiment of the present invention is for electrically connecting a CPU with a PCB. The electrical connector comprises an insulative base, a cover, and an actuation device for actuating the cover to slide along the the base. The base defines a plurality of receiving passageways respectively receiving corresponding electrical terminals therein. The cover defines a plurality of through holes corresponding to the receiving passageways. The base further defines a receiving space at one end thereof. A circular hole is defined in a bottom wall of the base below the receiving space, which can ensure that the base at the receiving space has a uniform thickness and enhanced intension during manufacturing.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
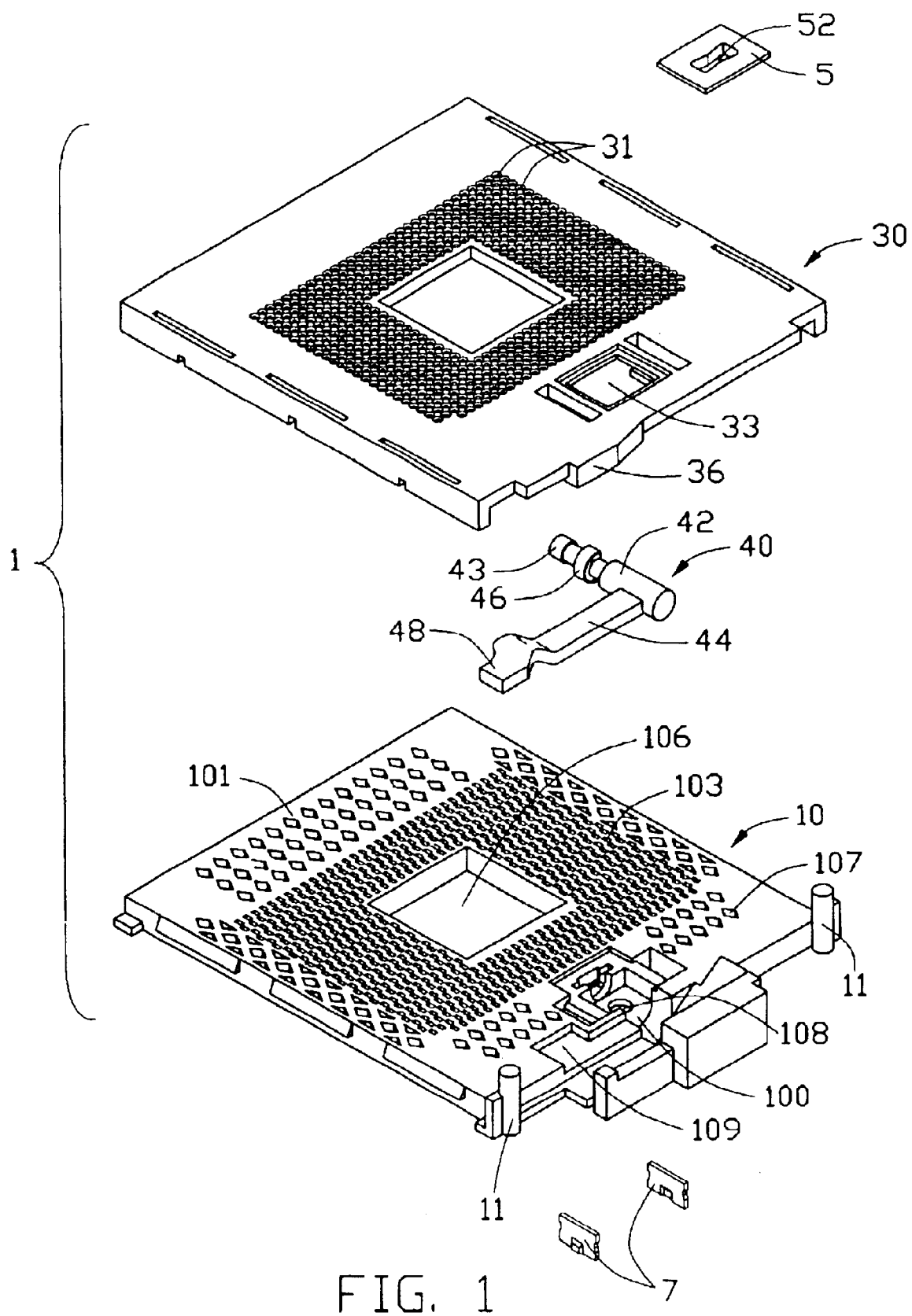
FIG. 1 is an exploded, isometric view of an electrical connector in accordance with a preferred embodiment of the present invention.
Figure 2:
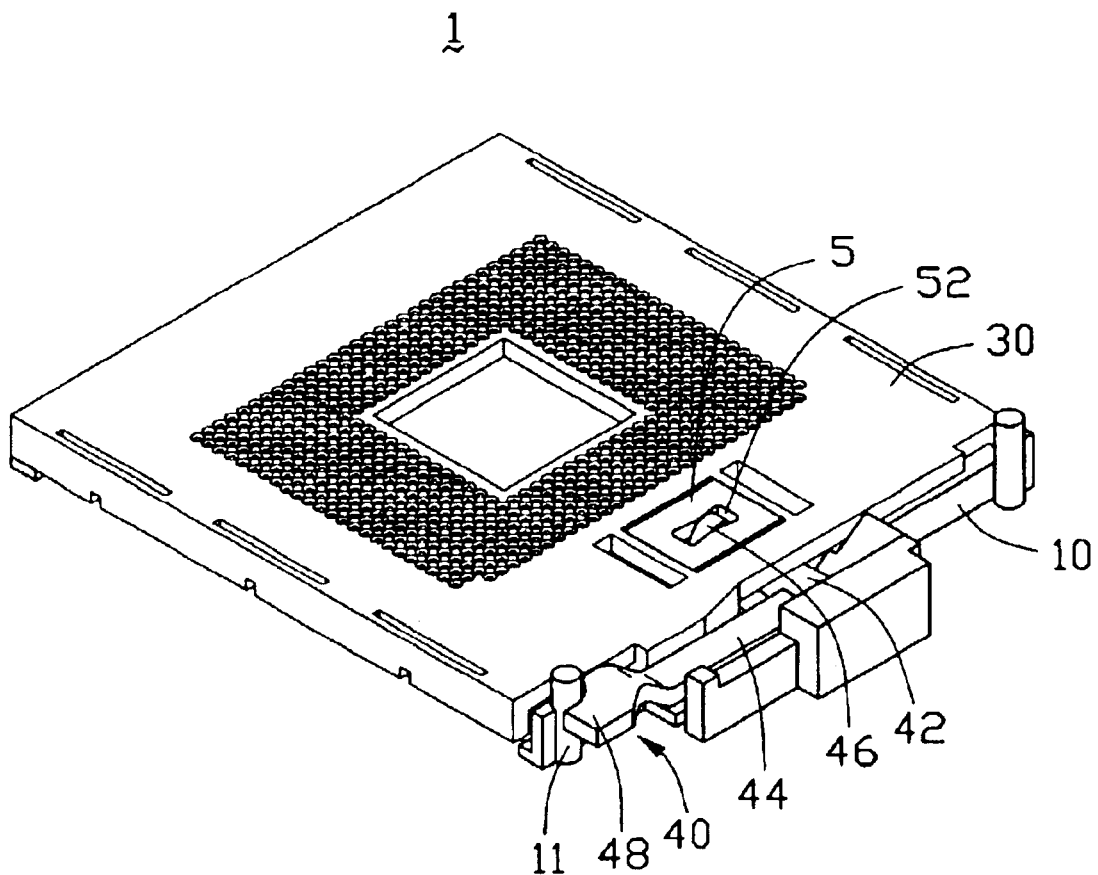
FIG. 2 is an assembled view of FIG. 1.
Figure 3:
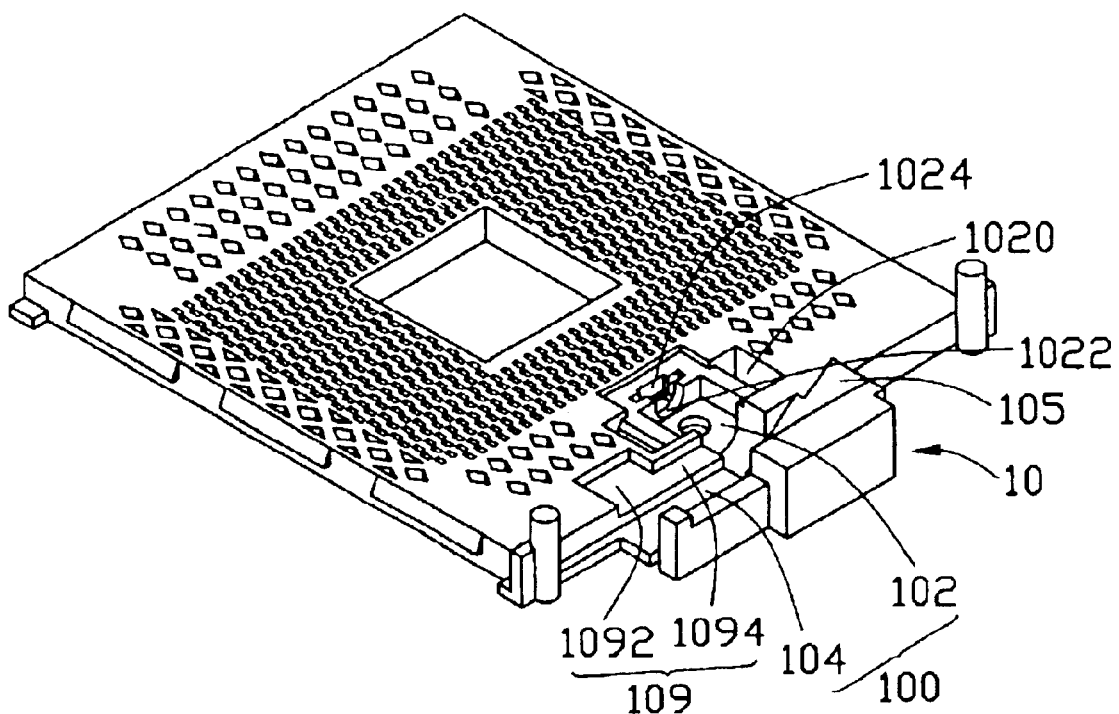
FIG. 3 is an isometric view of a base of the electrical connector of FIG. 1.
Figure 4:
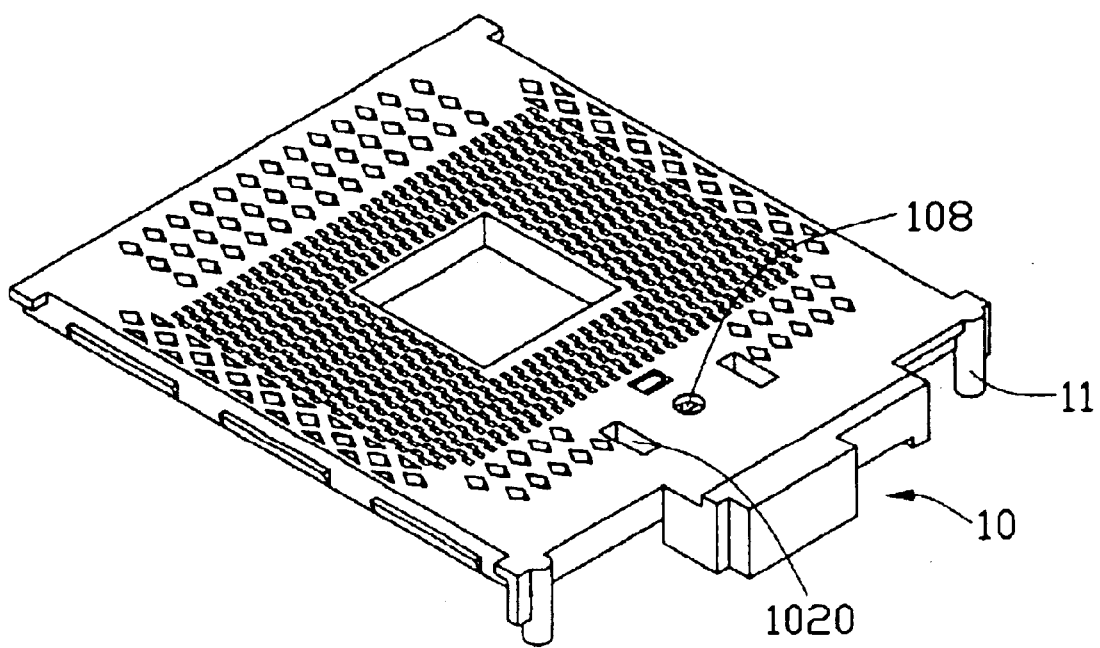
FIG. 4 is another isometric view of the base of the electrical connector of FIG. 1, but showing the base inverted.

Referring to FIGS. 1, 2, 3 and 4, an electrical connector 1 in accordance with a preferred embodiment of the present invention is for electrically connecting a central processing unit (CPU) (not shown) with a printed circuit board (PCB) (not shown). The connector 1 comprises a base 10 soldered and electrically connected with the PCB, a cover 30 slidably mounted on the base 10 and having the CPU attached thereon, and an actuation device 40 assembled between the cover 30 and the base 10 for actuating the cover 30 to slide along the base 10. The base 10 comprises a top surface 101 for mounting the cover 30 thereon. An opening 106 is defined in a middle of the base 10. A plurality of receiving passageways 103 is defined in the base 10, the passageways 103 being arranged in a rectangular array around the opening 106. A plurality of apertures 107 is defined in the base 10, the apertures 107 being arranged in rectangular arrays that cooperatively substantially surround the passageways 103. Each passageway 103 receives an electrical terminal (not shown) therein. A receiving space 100 is defined on the top surface 101 of the base 10 at one end thereof, for receiving the actuation device 40 therein. The receiving space 100 comprises a receiving cavity 102, and a receiving slot 104 in communication with the receiving cavity 102. A slantwise surface 105 is defined at a junction of the receiving cavity 102 and the receiving slot 104, for prevent the actuation device 40 from over-rotation. A pair of posts 11 is provided at two corners of the base 10, at opposite sides of the receiving space 100 respectively. A circular hole 108 is defined in a bottom wall of the base 10, below and in communication with the receiving cavity 102. An arched gap 1022 is defined in the base 10 adjacent and in communication with a side of the receiving cavity 102 that is opposite from the receiving slot 104. A receiving cutout 1024 is defined in the base 10 adjacent and in communication with a side of the arched gap 1022 that is opposite from the receiving cavity 102. A pair of through slots 1020 is defined in the base 10, at opposite sides of the receiving cavity 102 respectively. A recess 109 is defined in the top surface 101 of the base 10 adjacent the receiving slot 104. The recess 109 comprises a wide portion 1092, and a narrow portion 1094 in communication with the wide portion 1092.

The cover 30 defines a plurality of through holes 31 therein arranged in a rectangular array. The through holes 31 are for receiving lead pins (not shown) of the CPU, so that the lead pins can further extend into the passageways 103 of the base 10 and mechanically and electrically engage with the electrical terminals therein. A through cavity 33 is defined in one side portion of the cover 30, corresponding to the receiving space 100 of the base 10. A trapezoidal bulge 36 extends from one side edge of the cover 30 nearest the through cavity 33. A shape of the bulge 36 corresponds to a shape of the recess 109 of the base 10. Thus, when the cover 30 is assembled on the base 10, the bulge 36 can be slidably received in the recess 109.

The actuation device 40 comprises an actuating portion 42, and a handle portion 44 extending perpendicularly from the actuating portion 42. The handle portion 44 is for facilitating manual operation by a user. A holding portion 48 is formed at a free end of the handle portion 44, for engaging with one post 11 of the base 10 and thus positioning the actuation device 40 in a closed position. The actuating portion 42 and the handle portion 44 are received in the receiving cavity 102 of the base 10. The actuation portion 42 comprises a supporting portion 43 received in the receiving cutout 1024, and a spiral portion 46 received in the arched gap 1022. The spiral portion 46 of the actuating portion 42 is actuated by the handle portion 44 to actuate the cover 30 to slide along the base 10.

When the handle portion 44 is rotated to an open position, the lead pins of the CPU extend through the corresponding through holes 31 of the cover 30 and are received in the corresponding passageways 103 of the base 10. The lead pins of the CPU do not contact the corresponding electrical terminals. Thus the CPU is attached on the connector 1 with zero insertion force. When the handle portion 44 is rotated to the closed position, the actuation device 40 pushes the pins of the CPU into mechanical and electrical engagement with the corresponding electrical terminals.

The electrical connector 1 further comprises a cover plate 5 and a pair of lock plates 7. A window 52 is defined in a middle of the cover plate 5. Once the electrical connector 1 is assembled, the cover plate 5 is received in a top expanded portion of the through cavity 33 of the cover 30. The cover plate 5 covers the through cavity 33, except that the spiral portion 46 of the actuation device 40 is received in the window 52. The lock plates 7 are respectively engagingly received in the through slots 1020 of the base 10.

The electrical connector 1 of the present invention features the circular hole 108 in the bottom wall of the base 10 below the receiving space 100. During manufacturing of the electrical connector 1, stress produced in the base 10 around the circular hole 108 is substantially uniform. Thus, the bottom wall is less likely to distort when the actuation device 40 is assembled into the base 10. Furthermore, when molding the base 10 during manufacturing, melted plastic material can fully fill a region of the base 10 at the circular hole 108. This ensures that a thickness of the bottom wall at the receiving space 100 is uniform.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package to a circuit substrate, the electrical connector comprising:

an insulative base having a plurality of receiving passageways defined therein;

a plurality of electrical terminals respectively received in the corresponding receiving passageways;

a cover slidably engaged on the base, the cover having a plurality of through holes defined therethrough for receiving pins of the electronic package; and an actuation device comprising an actuating portion received between the base and the cover, and a handle portion extending from the actuating portion; said actuating portion and handle portion being of one-piece construction;

wherein a receiving space is defined in the base for receiving the actuating portion of the actuation device therein, and a circular through-hole is defined in a bottom wall of the base below the receiving space.

2. The electrical connector as claimed in claim 1, wherein the receiving space of the base comprises a receiving cavity and a receiving slot respectively receiving the actuating portion and the handle portion of the actuation device therein.

3. The electrical connector as claimed in claim 2, wherein the actuating portion of the actuation device comprises a supporting portion and a spiral portion.

4. The electrical connector as claimed in claim 3, wherein an actuate gap is defined at one side of the receiving cavity, and a receiving cutout is defined adjacent and in communication with the arched gap.

5. The electrical connector as claimed in claim 4, wherein the actuate gap and the receiving cutout respectively receives the spiral portion and the supporting portion of the actuating portion of the actuation device.

6. The electrical connector as claimed in claim 5, wherein a through cavity is defined in the cover for partly receiving the spiral portion of the actuating portion of the actuation device.

7. An electrical connector comprising:

an insulative base having a plurality of receiving passageways defined therein;

a plurality of electrical terminals respectively received in the corresponding receiving passageways;

a cover slidably engaged on the base, the cover having a plurality of through holes defined therethrough for receiving pins of the electronic package; and an actuation device comprising an actuating portion and a handle portion extending from the actuating portion; siad actuating portion and handle portion being of one-piece construction; wherein a receiving space is defined in the base to receive a main portion of the actuating portion of the actuation device therein, and said base further includes a bottom wall under said receiving space with therein a circular through-hole via which the receiving space downwardly communicates with an exterior.

8. The connector as claimed in claim 7, wherein said circular hole is dimensioned and configured to be laterally smaller than and different from the receiving space.

* * * * *